(12) United States Patent
Sato et al.

(10) Patent No.: US 10,669,397 B2
(45) Date of Patent: Jun. 2, 2020

(54) POLYMERIC PIEZOELECTRIC FILM AND METHOD FOR MANUFACTURING THEREOF

(71) Applicant: MITSUI CHEMICALS, INC., Minato-ku, Tokyo (JP)

(72) Inventors: Keisuke Sato, Nagoya (JP); Katsuki Onishi, Nagoya (JP); Hiroaki Tsushima, Nagoya (JP); Kazuhiro Tanimoto, Nagoya (JP); Toshihisa Kitagawa, Nagoya (JP)

(73) Assignee: MITSUI CHEMICALS, INC., Minato-Ku, Tokyo (JP)

( * ) Notice: Subject to any disclaimer, the term of this patent is extended or adjusted under 35 U.S.C. 154(b) by 538 days.

(21) Appl. No.: 15/550,154

(22) PCT Filed: Jan. 28, 2016

(86) PCT No.: PCT/JP2016/052537
§ 371 (c)(1),
(2) Date: Aug. 10, 2017

(87) PCT Pub. No.: WO2016/129400
PCT Pub. Date: Aug. 18, 2016

(65) Prior Publication Data
US 2018/0022895 A1    Jan. 25, 2018

(30) Foreign Application Priority Data

Feb. 13, 2015   (JP) .................. 2015-026709

(51) Int. Cl.
H01L 41/45    (2013.01)
C08K 5/29    (2006.01)
(Continued)

(52) U.S. Cl.
CPC ............... C08K 5/29 (2013.01); C08L 67/04 (2013.01); H01L 41/193 (2013.01); H01L 41/45 (2013.01);
(Continued)

(58) Field of Classification Search
CPC ......... C08K 5/29; C08L 67/04; H01L 41/193; H01L 41/45; C08F 2500/01; G01N 25/4866
(Continued)

(56) References Cited

U.S. PATENT DOCUMENTS 4,434,114 A    2/1984   Sprout, Jr.
8,829,121 B2   9/2014   Yoshida et al.
(Continued)

FOREIGN PATENT DOCUMENTS

CN    102484199 A    5/2012
JP    56-145604 A    11/1981
(Continued)

OTHER PUBLICATIONS

Extended Search Report issued by the European Patent Office in corresponding European Patent Application No. 16749044.0-1212 dated Oct. 2, 2018 (7 pages).
(Continued)

Primary Examiner — Thomas M Dougherty
(74) Attorney, Agent, or Firm — Buchanan Ingersoll & Rooney PC

(57) ABSTRACT

A polymeric piezoelectric film, including a helical chiral polymer (A) having a weight average molecular weight of from 50,000 to 1,000,000 and optical activity, in which, in the film: a crystallinity given by a DSC method is from 20% to 80%; a standardized molecular orientation MORc is from 3.5 to 15.0 when a reference thickness measured by a microwave transmission-type molecular orientation meter is
(Continued)

50 µm; and when a direction parallel to a phase difference streak is a direction X, a direction perpendicular to the direction X and parallel to a main plane of a film is a direction Y, and the phase difference streak is evaluated by an evaluation method A, per a length of 1,000 mm in the direction Y, a number of phase difference streaks with an evaluation value of 60 or more is 0, and a sum of the evaluation values of phase difference streaks with an evaluation value of 20 or more is 1000 or less.

11 Claims, 2 Drawing Sheets

(51) Int. Cl.
    *G01N 25/48*     (2006.01)
    *C08L 67/04*     (2006.01)
    *H01L 41/193*     (2006.01)

(52) U.S. Cl.
    CPC ...... *C08F 2500/01* (2013.01); *G01N 25/4866* (2013.01)

(58) Field of Classification Search
    USPC .................................................. 310/311, 800
    See application file for complete search history.

(56) References Cited

U.S. PATENT DOCUMENTS

| | | |
|---|---|---|
| 9,184,372 B2 | 11/2015 | Yoshida et al. |
| 2012/0132846 A1 | 5/2012 | Yoshida et al. |
| 2014/0051825 A1 | 2/2014 | Yoshida et al. |
| 2014/0339724 A1 | 11/2014 | Yoshida et al. |
| 2016/0099403 A1 | 4/2016 | Tanimoto et al. |
| 2016/0130387 A1 | 5/2016 | Sato et al. |

FOREIGN PATENT DOCUMENTS

| | | |
|---|---|---|
| JP | 58-134485 A | 8/1983 |
| JP | 05-152638 A | 6/1993 |
| JP | H08-336883 A | 12/1996 |
| JP | 2005-213376 A | 8/2005 |
| JP | 2008-539100 A | 11/2008 |
| JP | 2012-232584 A | 11/2012 |
| JP | 2014-086703 A | 5/2014 |
| WO | 2013/089148 A1 | 6/2013 |
| WO | WO 2014-168188 A1 | 10/2014 |
| WO | 2015/001956 A1 | 1/2015 |

OTHER PUBLICATIONS

First Notice of Opinion Examination issued by the State Intellectual Property Office of People's Republic of China in corresponding Chinese Patent Application No. 201680009057.5 dated Feb. 3, 2019 (8 pages including partial English translation).

International Search Report (PCT/ISA/210) dated Apr. 19, 2016, by the Japanese Patent Office as the International Searching Authority for International Application No. PCT/JP2016/052537.

Written Opinion (PCT/ISA/237) dated Apr. 19, 2016, by the Japanese Patent Office as the International Searching Authority for International Application No. PCT/JP2016/052537.

Notice of Submission of Opinion issued by the Korean Intellectual Property Office in corresponding Korean Patent Application No. 10-2017-7021918 dated Sep. 28, 2018 (9 pages including partial English translation).

POLYMERIC PIEZOELECTRIC FILM AND METHOD FOR MANUFACTURING THEREOF

TECHNICAL FIELD

The present invention relates to a polymeric piezoelectric film and a manufacturing method thereof.

BACKGROUND ART

Conventionally, PZT ($PbZrO_3$—$PbTiO_3$-based solid solution) which is a ceramic material has been widely used as a piezoelectric material. Since PZT contains lead, however, as a piezoelectric material, polymeric piezoelectric materials (polymeric piezoelectric films) having low environmental load and being rich in flexibility are now being used.

Currently known polymeric piezoelectric materials are poled polymers represented by Nylon 11, polyvinyl fluoride, polyvinyl chloride, polyurea, polyvinylidene fluoride (β-type) (PVDF), vinylidene fluoride-trifluoroethylene copolymer (P(VDF-TrFE)) (75/25), and the like.

In recent years, attention has been given to using polymers with optical activity, such as polylactic acids, in addition to the above-described polymeric piezoelectric materials. Polylactic acid-type polymers are known to express piezoelectricity only by a mechanically, stretching operation.

The piezoelectricity of polymer crystals such as polylactic acids among the polymers with the optical activity are caused by permanent dipoles with C=O bonds that are present in a helical axis direction. In particular, the polylactic acid has the low volume fraction of side chains based on that of main chains and the high percentage of permanent dipoles per volume, so that it may be said that it is an ideal polymer among the polymers having helical chirality. The polylactic acid that expresses the piezoelectricity only by the stretching treatment does not require poling treatment and is known to have a piezoelectric modulus that does not decrease for several years.

As described above, since polylactic acid has various piezoelectric characteristics, polymeric piezoelectric materials using various polylactic acids have been reported (see, for example, Patent Documents 1
Patent Document 1 Japanese Patent Application Laid-Open (JP-A. No. H05-152638
Patent Document 2 JP-A No. 2005-213376
Patent Document 3 JP-A No. 2014-086703

SUMMARY OF INVENTION

Technical Problem

Incidentally, in order to develop piezoelectricity, the polymeric piezoelectric film needs to orient the molecular chain in one direction. For example, Patent Document 3 describes a uniaxially stretched film in which molecular chains are oriented in a stretching direction by stretching in the longitudinal direction. In such a uniaxially stretched film, a streak (phase difference streak) tends to occur in a direction parallel to a stretching direction (a direction in which molecular chains are oriented).

Further, in the case of using uniaxially stretched films as described in Patent Document 3, they are easily torn parallel to the stretching direction, and they have a drawback in that the tear strength in a certain direction is low. Hereinafter, the tear strength in a certain direction is also referred to as "longitudinal tear strength".

Here, in order to obtain a polymeric piezoelectric film having easy alleviation of a streak and high longitudinal tear strength, generally, longitudinal and lateral magnifications are increased, and the longitudinal and lateral magnifications are brought close to the same extent to perform stretching. However, when the longitudinal and lateral magnifications are brought close to the same extent, the orientation of molecular chains deteriorates and the piezoelectricity of a polymeric piezoelectric film deteriorates.

On the other hand, the present inventors intensively studied to find that a piezoelectric polymer film having excellent longitudinal tear strength while maintaining the piezoelectricity can be obtained by reducing phase difference streaks, thereby completing the present invention.

An object of the present invention is to provide a polymeric piezoelectric film having reduced phase difference streaks and excellent longitudinal tear strength while maintaining piezoelectricity and a method of manufacturing the same.

Solution to Problem

Specific means for achieving the problems are as follows.
<1> A polymeric piezoelectric film, comprising a helical chiral polymer (A) having a weight average molecular weight of from 50,000 to 1,000,000 and optical activity, wherein, in the film: a crystallinity given by a DSC method is from 20% to 80%; a standardized molecular orientation MORc is from 3.5 to 15.0 when a reference thickness measured by a microwave transmission-type molecular orientation meter is 50 μm; and when a direction parallel to a phase difference streak is a direction X, a direction perpendicular to the direction X and parallel to a main plane of a film is a direction Y, and the phase difference streak is evaluated by an evaluation method A, per a length of 1,000 mm in the direction Y, a number of phase difference streaks with an evaluation value of 60 or more is 0, and a sum of evaluation values of phase difference streaks with an evaluation value of 20 or more is 1000 or less, the evaluation method A comprising:
(a) with respect to the direction Y, acquiring in-plane phase difference data of a film at intervals of 0.143 mm to obtain an in-plane phase difference profile;
(b) performing fast Fourier transformation on the obtained in-plane phase difference profile, removing low frequency components using 0.273/mm as a cutoff frequency, and then performing inverse Fourier transformation;
(c) calculating slopes of two adjacent points with respect to the in-plane phase difference profile after inverse Fourier transformation and converting the slopes into a slope profile; and
(d) taking a height from a bottom point of a valley of the obtained slope profile to an apex of a mountain adjacent to the valley as an evaluation value of a phase difference streak.
<2> The polymeric piezoelectric film according to <1>, wherein, when evaluated by the evaluation method A, per a length of 1,000 mm in the direction Y, a number of phase difference streaks with an evaluation value of 40 or more is 0, and a sum total of evaluation values of phase difference streaks with an evaluation value of 20 or more is 200 or less.
<3> The polymeric piezoelectric film according to <1> or <2>, wherein, when evaluated by the evaluation method A, per a length of 1,000 mm in the direction Y, a number of phase difference streaks with an evaluation value of 20 or more is 0, and a sum total of evaluation values of phase difference streaks with an evaluation value of 20 or more is 0.

<4> The polymeric piezoelectric film according to any one of <1> to <3>, wherein internal haze for visible light is 50% or less, and a piezoelectric constant $d_{14}$ measured by a stress-charge method at 25° C. is 1 pC/N or more.

<5> The polymeric piezoelectric film according to any one of <1> to <4>, wherein internal haze for visible light is 13% or less.

<6> The polymeric piezoelectric film according to any one of <1> to <5>, wherein the helical chiral polymer (A) is a polylactic acid-type polymer having a main chain containing a repeating unit represented by the following Formula (1).

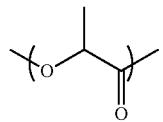

(1)

<7> The polymeric piezoelectric film according to any one of <1> to <6>, wherein a content of the helical chiral polymer (A) is 80% by mass or more.

<8> The polymeric piezoelectric film according to any one of <1> to <7>, wherein a product of the standardized molecular orientation MORc and the crystallinity is from 75 to 700.

<9> The polymeric piezoelectric film according to any one of <1> to <8>, wherein internal haze for visible light is 1.0% or less.

<10> The polymeric piezoelectric film according to any one of <1> to <9>, the film containing from 0.01 parts by mass to 10 parts by mass of a stabilizer having one or more functional groups selected from the group consisting of a carbodiimide group, an epoxy group, and an isocyanate group, the stabilizer having a weight average molecular weight of 200 to 60,000 (B) based on 100 parts by mass of the helical chiral polymer (A).

<11> A method of manufacturing the polymeric piezoelectric film according to any one of <1> to <10> the method comprising: a step of extruding a composition containing the helical chiral polymer (A) from a T-die having a lip tip edge radius of from 0.001 mm to 0.100 trim at an extrusion temperature of from 200° C. to 230° C. to form the composition into a film; and a step of stretching the formed film.

Advantageous Effects of Invention

According to the present invention, a polymeric piezoelectric film having reduced phase difference streaks and excellent longitudinal tear strength while maintaining piezoelectricity; and a method of manufacturing the same can be provided.

DESCRIPTION OF EMBODIMENTS

Figure 1:
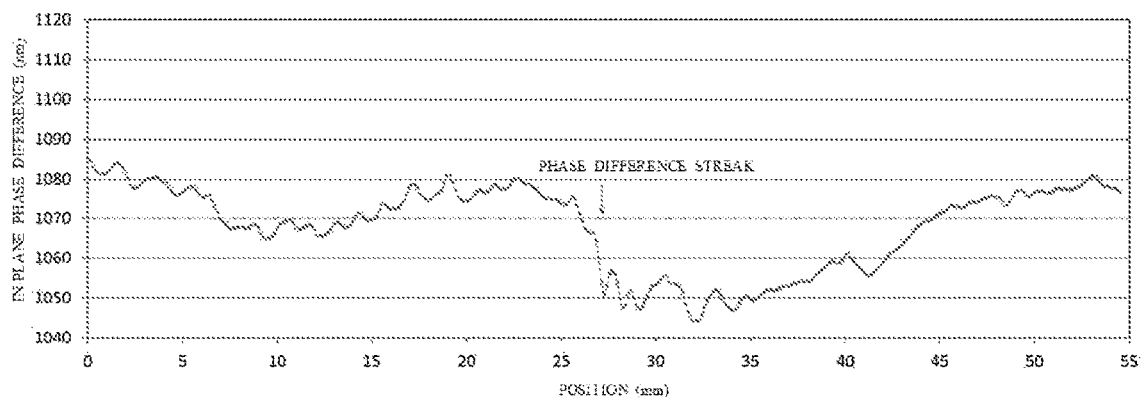
FIG. 1 is a graph illustrating an in-plane phase difference profile of a film acquired for a polymeric piezoelectric film of Comparative Example 1.

Hereinafter, one embodiment of the polymeric piezoelectric film of the present invention will be described.

A numeral value range represented by "(a value) to (a value)" means a range including the numeral values represented before and after "(a value) to (a value)" as a lower limit value and an upper limit value, respectively.

The term "film" is herein a concept that includes not only what is generally called "film" but also what is commonly called "sheet".

Herein, a film surface means a principal plane of a film. Here, the t "principal plane" refers to a plane having the largest area among the surfaces of the polymeric piezoelectric film. The polymeric piezoelectric film of the present embodiment may have two or more principal planes. For example, when the polymeric piezoelectric film has two plates A with a size of 10 mm×0.3 mm, two plates 13 with a size of 3 mm×0.3 mm, and two plates C with a size of 10 mm×3 mm, the principal plane of the polymeric piezoelectric film is the plate C, and the film has two principal planes.

Herein, the term "MD direction" means a flow direction of a film (Machine Direction); and the term "TD direction" means a direction perpendicular to the MD direction and parallel to the principal plane of the film (Transverse Direction).

<Polymeric Piezoelectric Film>

A polymeric piezoelectric film according to one embodiment of the invention is a polymeric piezoelectric film comprising a helical chiral polymer (A) having a weight average molecular weight of from 50,000 to 1,000,000 and optical activity, wherein, in the film: a crystallinity given by a DSC method is from 20% to 80%; a standardized molecular orientation MORc is from 3.5 to 15.0 when a reference thickness measured by a microwave transmission-type molecular orientation meter is 50 µm; and when a direction parallel to a phase difference streak is a direction X, a direction perpendicular to the direction X and parallel to a main plane of a film is a direction Y, and the phase difference streak is evaluated by an evaluation method A; per a length of 1,000 mm in the direction Y, the number of phase difference streaks with an evaluation value of 60 or more is 0, and the sum of evaluation values of phase difference streaks with an evaluation value of 20 or more is 1000 or less, the evaluation method A comprising:

(a) with respect to the direction Y, acquiring in-plane phase difference data of a film at intervals of 0.143 mm to obtain an in-plane phase difference profile;

(b) performing fast Fourier transformation on the obtained in-plane phase difference profile, removing low frequency components using 0.273/mm as a cutoff frequency, and then performing inverse Fourier transformation;

(c) calculating slopes of two adjacent points with respect to the in-plane phase difference profile after inverse Fourier transformation and converting the slopes into a slope profile; and (d) taking height from a bottom point of a valley of the obtained slope profile to an apex of a mountain adjacent to the valley as an evaluation value of a phase difference streak.

When a polymeric piezoelectric film has the above-described configuration, phase difference streaks are reduced and the longitudinal tear strength is excellent while maintaining the piezoelectricity.

More specifically, when the phase difference streak is evaluated by the evaluation method A, since, per a length of 1,000 mm in the direction Y, the number of phase difference streaks with an evaluation value of 60 or more is 0 and the total sum of the evaluation values of the phase difference steaks with an evaluation value of 20 or more is 1,000 or less, the phase difference streaks of the polymeric piezoelectric film are reduced, and as a result, a polymeric piezoelectric film having excellent longitudinal tear strength while maintaining piezoelectricity can be provided.

That the tear strength in a certain direction deteriorates is occasionally expressed herein as "longitudinal tear strength deteriorates", and a situation where the tear strength in a certain direction is low, is occasionally expressed herein as "longitudinal tear strength is low".

That a phenomenon of deterioration of the tear strength in a certain direction is suppressed, is occasionally expressed herein as "longitudinal tear strength is improved", and a situation where the phenomenon of deterioration of the tear strength in a certain direction is suppressed, is occasionally expressed as "longitudinal tear strength is high" or "excellent longitudinal tear strength".

The polymeric piezoelectric film contains a helical chiral polymer (A) having a weight average molecular weight (Mw) of 50,000 to 1,000,000. When the helical chiral polymer (A) has a weight average molecular weight of 50,000 or more, the mechanical strength of the helical chiral polymer (A) as a molded body improves. When the weight average molecular weight of the helical chiral polymer (A) is 1,000,000 or less, the formability when forming the polymeric piezoelectric film by molding (for example, extrusion molding) is improved.

In the polymeric piezoelectric film, the crystallinity obtained by the DSC method is from 20% to 80%. Therefore, the polymeric piezoelectric film has a favorable balance between the piezoelectricity, transparency and longitudinal tear strength, and since whitening or breaking is less likely to occur when stretching the polymeric piezoelectric film, it is easy to manufacture the film.

More specifically, when the crystallinity is 20% or more, the piezoelectricity of the polymeric piezoelectric film is maintained high, and when the crystallinity is 80% or less, deterioration of the longitudinal tear strength and transparency of the polymeric piezoelectric film can be suppressed.

The polymeric piezoelectric film has a standardized molecular orientation MORc of from 3.5 to 15.0.

When the standardized molecular orientation MORc is 3.5 or more, there are many molecular chains (for example, polylactic acid molecular chains) of the helical chiral polymer (A) having optical activity arranged in the stretching direction, and as a result, the rate at which oriented crystals are generated increases, and the polymeric piezoelectric film can exhibit a high piezoelectricity.

When the standardized molecular orientation MORc is 15.0 or less, the longitudinal tear strength of the polymeric piezoelectric film is improved.

[Evaluation Method A]

In a polymeric piezoelectric film according to the present embodiment, a phase difference streak is evaluated by an evaluation method A, per a length of 1,000 mm in the direction Y, the number of phase difference streaks with an evaluation value of 60 or more is 0, and the sum of the evaluation values of phase difference streaks with an evaluation value of 20 or more is 1000 or less. Therefore, the polymeric piezoelectric film has reduced streaks, and as a result, it has excellent longitudinal tear strength while maintaining piezoelectricity.

Hereinafter, the evaluation method A which is a method of evaluating the phase difference streaks of the polymeric piezoelectric film according to the present embodiment will be described. The evaluation method A is performed by the following procedures (a) to (d).

(a) With respect to the direction Y, in-plane phase difference data of a film is acquired at intervals of 0.143 mm to obtain an in-plane phase difference profile.

(b) Fast Fourier transformation is performed on the obtained in-plane phase difference profile, low frequency components are removed using 0.273/mm as a cutoff frequency, and then inverse Fourier transformation is performed.

(c) Slopes of two adjacent points with respect to the in-plane phase difference profile after inverse Fourier transformation are calculated and the slopes are converted into a slope profile.

(d) A height from a bottom point of a valley of the obtained slope profile to an apex of a mountain adjacent to the valley is taken as an evaluation value of a phase difference streak.

First, in the above-described (a), in-plane phase difference data (phase difference amount) of a film is acquired for a direction (a direction Y, for example, a TD direction) perpendicular to a direction (a direction X, for example, an MD direction) parallel to a phase difference streak (for example, fine streak-like irregularities of nm order occurring in the MD direction which is a direction of a flow of the film), and parallel to a main plane of the film at intervals of 0.143 mm to obtain an in-plane phase difference profile. The in-plane phase difference data of the film can be obtained, for example, by using a wide range birefringence evaluation system "WPA-100" manufactured by Photonic Lattice, Inc. The in-plane phase difference data (phase difference amount) of the film is the product of the birefringence and the thickness, and assuming that the birefringence is constant, the amount of the phase difference is proportional to the thickness.

In the above-described (b), the in-plane phase difference profile obtained by the above-described (a) is subjected to fast Fourier transformation, low frequency components are removed using 0.273/mm as a cutoff frequency, and then inverse Fourier transformation is performed. Here, a high frequency component of the in-plane phase difference profile is caused by the phase difference streaks of the film, and a low frequency component of the in-plane phase difference profile is caused by the thickness unevenness (undulation) of the film, Therefore, by removing low frequency components of the in-plane phase difference profile, only high frequency components caused by the phase difference streaks of the film can be extracted.

Next, in the above-described (c), the slope of two adjacent points in the in-plane phase difference profile after the inverse Fourier transformation is calculated and converted into a slope profile. Then, in the above-described (d), the height from the bottom point of a valley of the obtained slope profile to the apex of a mountain adjacent to the valley is obtained, and the height is taken as an evaluation value of a phase difference streak. This evaluation value of a phase difference streak corresponds to the intensity of a phase difference streak, and the higher the numerical value is, the more conspicuous phase difference streak is generated, and therefore, the numerical value is preferably low. Further, the sum of evaluation values of phase difference streaks per a length of 1,000 mm in the direction Y corresponds to the influence of a phase difference streak on the surface of a film, and the higher the numerical value is, the more the phase difference streaks are generated in a wider range, or the more conspicuous phase difference streaks are generated, and therefore, the numerical value is preferably low.

In the polymeric piezoelectric film according to the present embodiment, when evaluating the phase difference streak by the evaluation method A, per a length of 1,000 mm in the direction Y, it is preferable that the number of phase difference streaks with an evaluation value of 40 or more is 0 and the sum of evaluation values of phase difference streaks with an evaluation value of 20 or more is 200 or less, and it is more preferable that the number of phase difference streaks with an evaluation value of 20 or more is 0 and the sum of evaluation values of phase difference streaks with an evaluation value of 20 or more is 0. By this, the phase difference streaks of the polymeric piezoelectric film are further reduced, and as a result, the film is more excellent in the longitudinal tear strength while more favorably maintaining the piezoelectricity.

In the above-described evaluation method A, a phase difference streak and the sum of phase difference streaks based on the length of 1,000 mm in the direction Y are evaluated, and, in a polymeric piezoelectric film whose length in the direction Y is less than 1,000 mm or whose length in the direction Y exceeds 1,000 mm, the number of phase difference streaks with an evaluation value of 60 or more and the sum of evaluation values of phase difference streaks with an evaluation value of 20 or more are converted into values per a length of 1,000 mm in the direction Y, respectively. For example, in a polymeric piezoelectric film having a length of 500 mm in the direction Y, the obtained number of phase difference streaks with an evaluation value of 60 or more and total sum of the evaluation values of phase difference streaks with an evaluation value of 20 or more are respectively doubled to be converted into values per 1,000 mm length in the direction Y.

[Optically Active Helical Chiral Polymer (A)]

An optically active helical chiral polymer (A) (hereinafter, also referred to as "helical chiral polymer (A)") refers to a polymer with a weight average molecular weight of from 50,000 to 1,000,000 having a helical molecular structure and having molecular optical activity.

Examples of the helical chiral polymer (A) include polypeptide, cellulose, a cellulose derivative, a polylactic acid-type polymer, polypropylene oxide, and poly(β-hydroxybutyric acid). Examples of the polypeptide include poly(γ-benzyl glutarate), and poly(γ-methyl glutarate). Examples of the cellulose derivative include cellulose acetate, and cyanoethyl cellulose.

The optical purity of the helical chiral polymer (A) is preferably 95.00% ee or higher, more preferably 97.00% ee or higher, further preferably 99.00% ee or higher, and particularly preferably 99.99% ee or higher from a viewpoint of enhancing the piezoelectricity of a polymeric piezoelectric film. Desirably, the optical purity of the optically active polymer is 100.00% ee. It is presumed that, by selecting the optical purity of the helical chiral polymer (A) in the above range, packing of a polymer crystal exhibiting piezoelectricity becomes denser and as the result the piezoelectricity is improved.

The optical purity of the helical chiral polymer (A) in the present embodiment is a value calculated according to the following formula:

Optical purity(% ee)=100×|L-form amount−D-form amount|/(L-form amount+D-form amount);

Specifically, the optical purity is a value obtained by multiplying (multiplying) 'the value obtained by dividing (dividing) "the amount difference (absolute value) between the amount [% by mass] of helical chiral polymer (A) in L-form and the amount [% by mass] of helical chiral polymer (A) in D-form" by "the total amount of the amount [% by mass] of helical chiral polymer (A) in L-form and the amount [% by mass] helical chiral polymer (A) in D-form" by '100'.

For the L-form amount [% by mass] of the helical chiral polymer (A) and the D-form amount [% by mass] of the helical chiral polymer (A), values to be obtained by a method using high performance liquid chromatography (HPLC) are used. Specific particulars with respect to a measurement will be described below.

Among the above helical chiral polymers (A), a polymer with the main chain containing a repeating unit according to the following Formula (1) is preferable from a viewpoint of enhancement of the optical purity and improving the piezoelectricity.

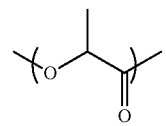

(1)

Examples of a compound with the main chain containing a repeating unit represented by the Formula (1) include a polylactic acid-type polymer. Among others, polylactic acid is preferable, and a homopolymer of L-lactic acid (PLLA) or a homopolymer of D-lactic acid (PDLA) is most preferable.

The polylactic acid-type polymer means "polylactic acid", a "copolymer of one of L-lactic acid or D-lactic acid, and a copolymerizable multi-functional compound", or a mixture of the two. The "polylactic acid" is a polymer linking lactic acid by polymerization through ester bonds into a long chain, and it is known that polylactic acid can be produced by a lactide process via a lactide, a direct polymerization process, by which lactic acid is heated in a solvent under a reduced pressure for polymerizing while removing water; or the like. Examples of the "polylactic acid" include a homopolymer of L-lactic acid, a homopolymer of D-lactic acid; a block copolymer including a polymer of at least one of L-lactic acid and D-lactic acid, and a graft copolymer including a polymer of at least one of L-lactic acid and D-lactic acid.

Examples of the "copolymerizable multi-functional compound" include a hydroxycarboxylic acid, such as glycolic acid, dimethylglycolic acid, 3-hydroxybutyric acid, 4-hydroxybutyric acid, 2-hydroxypropanoic acid, 3-hydroxypropannoic acid, hydroxyvaleric acid, 3-hydroxyvaleric acid, 4-hydroxyvaleric acid, 5-hydroxyvaleric acid, 2-hydroxycaproic acid, 3-hydroxycaproic acid; 4-hydroxycaproic acid; 5-hydroxycaproic acid, 6-hydroxycaproic acid, 6-hydroxymethylcaproic acid, and mandelic acid; a cyclic ester, such as glycolide, β-methyl-δ-valerolactone, γ-valerolactone, and ε-caprolactone; a polycarboxylic acid, such as oxalic acid, malonic acid, succinic acid, glutaric acid, adipic acid, pimelic acid, azelaic acid, sebacic acid, undecanedioic acid, dodecanedioic acid; and terephthalic acid, and an anhydride thereof; a polyhydric alcohol, such as ethylene glycol, diethylene triethylene glycol, 1,2-propanediol, 1,3- propanediol, 1,3-butanediol, 1,4-butanediol, 2,3-butanediol, 1,5-pentanediol, 1,6-hexanediol, 1,9-nonanediol, 3-methyl-1,5-pentanediol, neopentylglycol, tetramethylene glycol, and 1,4-hexanedimethanol; a polysaccharide such as cellulose; and an aminocarboxylic acid such as α-amino acid.

Examples of the above "copolymerizable polyfunctional compound" include a compound described in paragraph 0028 of WO 2013/054918.

Examples of the "copolymer of one of L-lactic acid or D-lactic acid, and a copolymerizable polyfunctional compound" include a block copolymer or a graft copolymer having a polylactic acid sequence, which can form a helical crystal.

The concentration of a structure derived from a copolymer component in the helical chiral polymer (A) is preferably 20 mol % or less. For example, when the helical chiral polymer (A) is a polylactic acid-type polymer, with respect to the total number of moles of a structure derived from lactic acid and a structure derived from a compound copolymerizable with lactic acid (copolymer component) in the polylactic acid-type polymer, the copolymer component is preferably 20 mol % or less.

The helical chiral polymer (A) (for example, polylactic acid-type polymer) can be produced, for example, by a method of obtaining the polymer by direct dehydration condensation of lactic acid, as described in JP-A No. S59-096123 and JP-A No. H07-033861, or a method of obtaining the same by a ring-opening polymerization of lactide, which is a cyclic dimer of lactic acid, as described in U.S. Pat. Nos. 2,668,182 and 4,057,357.

In order to make the optical purity of the helical chiral polymer (A) (for example, polylactic acid-type polymer) obtained by any of the production processes to 95.00% ee or higher, for example, when a polylactic acid is produced by a lactide process, it is preferable to polymerize lactide, whose optical purity has been enhanced to 95.00% ee or higher by a crystallization operation.

(Weight Average Molecular Weight of Helical Chiral Polymer (A))

The weight average molecular weight (Mw) of the helical chiral polymer (A) used in the present embodiment is from 50,000 to 1,000,000.

When the weight average molecular weight of the helical chiral polymer (A) is 50,000 or higher, the mechanical strength of a molded body from the helical chiral polymer (A) improves. The weight average molecular weight of the helical chiral polymer (A) is preferably 100,000 or higher, and more preferably 150,000 or higher, from a viewpoint of further improving the mechanical strength when formed into a molded body.

When the weight average molecular weight of the helical chiral polymer (A) is 1,000,000 or less, moldability when a polymeric piezoelectric film is obtained by molding (for example, extrusion molding) improves. The weight average molecular weight of the helical chiral polymer (A) is preferably 800,000 or less, and more preferably 300,000 or less, from a viewpoint of further improving the formability at the time of obtaining a polymeric piezoelectric film.

The molecular weight distribution (Mw/Mn) of the helical chiral polymer (A) is preferably from 1.1 to 5, more preferably from 1.2 to 4, and further preferably from 1.4 to 3, from a viewpoint of the strength of a polymeric piezoelectric film. The weight average molecular weight Mw and the molecular weight distribution (Mw/Mn) of a polylactic acid polymer are measured using a gel permeation chromatograph (GPC) by the following GPC measuring method.

—GPC Measuring Apparatus—

GPC-100 manufactured by Waters Corp.

—Column—

Shodex LF-804 manufactured by Showa Denko K. K,

—Preparation of Sample—

A helical chiral polymer (A) is dissolved in a solvent (for example, chloroform) at 40° C. to prepare a sample solution with the concentration of 1 mg/mL.

—Measurement Condition—

A sample solution 0.1 mL is introduced into the column at a temperature of 40° C. and a flow rate of 1 mL/min by using a solvent [chloroform].

The sample concentration in a sample solution separated by the column is measured by a differential refractometer. Based on polystyrene standard samples, a universal calibration curve is created and the weight average molecular weight (Mw) and the molecular weight distribution (Mw/Mn) of a helical chiral polymer (A) are calculated.

For a polylactic acid-type polymer which is an example of a helical chiral polymer (A), a commercial polylactic acid may be used, and examples thereof include PURASORB (PD, PL) manufactured by Purac Corporate, LACER (H-100, H-400) manufactured by Mitsui Chemicals, Inc., and Ingeo™ biopolymer manufactured by NatureWorks LLC.

When a polylactic acid-type polymer is used as the helical chiral polymer (A) and in order to make the weight average molecular weight (Mw) of the polylactic acid polymer 50,000 or higher, it is preferable to produce the helical chiral polymer (A) by a lactide process, or a direct polymerization process.

A polymeric piezoelectric film of the present embodiment may contain only one kind of the helical chiral polymer (A), or may contain two or more kinds thereof.

Although there is no particular restriction on a content (if two or more kinds are used, the total content; hereinafter holds the same) of the helical chiral polymer (A) in a polymeric piezoelectric film of the present embodiment, 80% by mass or more with respect to the total mass of the polymeric piezoelectric film is preferable.

When the content is 80% by mass or more, a piezoelectric constant tends to improve.

[Stabilizer (B)]

A polymeric piezoelectric film of the present embodiment may contain, as a stabilizer (B), a compound which has at least one functional group selected from the group consisting of a carbodiimide group, an epoxy group, and an isocyanate group and whose weight average molecular weight is from 200 to 60,000. By this, the moisture and heat resistance of a polymeric piezoelectric film is further improved.

Further, as the stabilizer (B), the polymeric piezoelectric film preferably has at least one functional group selected from the group consisting of a carbodiimide group, an epoxy group and an isocyanate group in one molecule.

For the stabilizer (B), "stabilizer (B)" described in paragraphs 0039 to 0055 of WO 2013/054918 A can be used.

Examples of a compound having, in one molecule, a carbodiimide group (carbodiimide compound) which can be used as the stabilizer (B) include a monocarbodiimide compound, a polycarbodiimide compound, and a cyclic carbodiimide compound.

For the monocarbodiimide compound, dicyclohexylcarbodiimide, diisopropylphenylcarbodiimide, or the like is suitable.

As the polycarbodiimide compound, polycarbodiimide compounds manufactured by various methods can be used. Polycarbodiimide compounds manufactured by conventional methods of manufacturing a polycarbodiimide (for example, U.S. Pat. No. 2,941,956, Japanese Patent Publication (JP-B) No. S47-33279, J. Org. Chem. 28, 2069-2075 (1963), Chemical Review 1981, Vol. 81, No. 4, p 619-621) can be used. Specifically, a carbodiimide compound described in Japanese Patent No. 4084953 can be also used.

Examples of the polycarbodiimide compound include poly(4,4'-dicyclohexylmethanecarbodiimide), poly(N,N'-di-2,6-diisopropylphenylcarbodiimide), and poly(1,3,5-triisopropylphenylene-2,4-carbodiimide.

The cyclic carbodiimide compound can be synthesized based on a method described in JP-A No. 2011-256337, or the like.

As the carbodiimide compound, a commercially available product may be used. Examples thereof include B2756 (trade name) manufactured by Tokyo Chemical Industry Co., CARBODILITE LA-1 (trade name) manufactured by Nisshinbo Chemical Inc., and Stabaxol P, Stabaxol P400, and Stabaxol I (all are trade names) manufactured by Rhein Chemie GmbH.

Examples of a compound having, in one molecule, an isocyanate group (isocyanate compound) which can be used as the stabilizer (B) include 3-(triethoxysilyl)propyl isocyanate, 2,4-tolylene diisocyanate, 2,6-tolylene diisocyanate, m-phenylene diisocyanate, p-phenylene diisocyanate, 4,4'-diphenylmethane diisocyanate, 2,4'-diphenylmethane diisocyanate, 2,2'-diphenylmethane diisocyanate, xylylene diisocyanate, hydrogenated xylylene diisocyanate, and isophorone diisocyanate.

Examples of a compound having, in one molecule, an epoxy group (epoxy compound) which can be used as the stabilizer (B) include phenyl glycidyl ether, diethyl eneglycol diglycidyl ether, bisphenol A-diglycidyl ether, hydrogenated bisphenol A-diglycidyl ether, a phenol novolac-type epoxy resin, a cresol novolac-type epoxy resin, and epoxidized polybutadiene.

The weight average molecular weight of the stabilizer (B) is from 200 to 60,000 as described above, more preferably from 200 to 30,000, and still more preferably from 300 to 18,000.

When the weight average molecular weight of the stabilizer (B) is within the above range, the stabilizer (B) moves more easily, and an effect of improving the moisture and heat resistance is exhibited more effectively.

The weight average molecular weight of the stabilizer (B) is particularly preferably from 200 to 900. The weight average molecular weight of from 200 to 900 nearly corresponds to the number average molecular weight of from 200 to 900. When the weight average molecular weight is from 200 to 900, the molecular weight distribution is 1.0 in some cases. In such cases, "weight average molecular weight of from 200 to 900" can be simply paraphrased as "molecular weight of from 200 to 900".

When a polymeric piezoelectric film contains the stabilizer (B), the polymeric piezoelectric film may contain only one type of stabilizer (B), or may contain two or more types of stabilizers.

When a polymeric piezoelectric film contains the helical chiral polymer (A) and the stabilizer (B), the content (total content when the material contains two or more types) of the stabilizer (B) is, with respect to 100 parts by mass of helical chiral polymer (A), preferably from 0.01 part by mass to 10 parts by mass, more preferably from 0.01 part by mass to 5 parts by mass, further preferably from 0.1 part by mass to 3 parts by mass, and particularly preferably from 0.5 parts by mass to 2 parts by mass.

When the above content is 0.01 part by mass or more, the moisture and heat resistance is further improved.

When the above content is 10 parts by mass or less, deterioration of the transparency is further suppressed.

Examples of a preferable mode of the stabilizer (B) include a mode in which a stabilizer (S1) which has at least one functional group selected from the group consisting of a carbodiimide group, an epoxy group, and an isocyanate group, and has a number average molecular weight of from 200 to 900, and a stabilizer (S2) which has, in one molecule, two or more functional groups of one or more kinds selected from the group consisting of a carbodiimide group, an epoxy group, and an isocyanate group, and has a weight average molecular weight of from 1,000 to 60,000 are used in combination. The weight average molecular weight of the stabilizer (S1) having a number average molecular weight of from 200 to 900 is about from 200 to 900. The number average molecular weight and the weight average molecular weight of the stabilizer (S1) have almost the same values.

When the stabilizer (S1) and the stabilizer (S2) are used in combination as the stabilizer (B), the stabilizer preferably includes a large amount of the stabilizer (S1) from a viewpoint of improving transparency.

Specifically, with respect to 100 parts by mass of the stabilizer (S1), amount of the stabilizer (S2) is preferably in a range of from 10 parts by mass to 150 parts by mass from a viewpoint of coexistence of transparency and moisture and heat resistance, more preferably in a range of from 30 parts by mass to 100 parts by mass, and particularly preferably in a range of from 50 parts by mass to 100 parts by mass.

Specific examples (stabilizers SS-1 to SS-3) of the stabilizer will be described below.

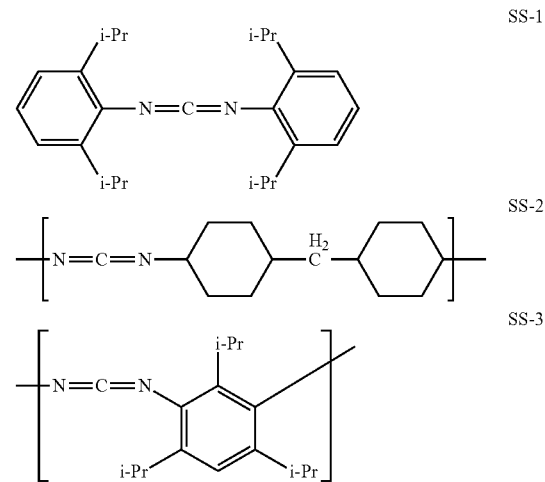

Regarding the above stabilizers SS-1 to SS-3, the name of the compound, a commercially available product, and the like are described below.

Stabilizer SS-1•••The name of the compound is bis-2,6-diisopropylphenylcarbodiimide. The weight average molecular weight (in this example, simply equivalent to "molecular weight") is 363. Examples of the commercially available product include "Stabaxol I" manufactured by Rhein Chemie GmbH and "B2756" manufactured by Tokyo Chemical industry Co., Ltd.

Stabilizer SS-2•••The name of the compound is poly(4, 4'-dicyclohexylmethanecarbodiimide).

Examples of the commercially available product include "carbodilite LA-1" manufactured by Nisshinbo Chemical Inc. as one having a weight average molecular weight of about 2,000.

Stabilizer SS-3••• The name of the compound is poly(1, 3,5-triisopropylphenylene-2,4-carbodiimide).

Examples of the commercially available product include "Stabaxol P" manufactured by Rhein Chemie GmbH as one having a weight average molecular weight of about 3,000. Examples of those having a weight average molecular weight of 20,000 include "Stabaxol P400" manufactured by Rhein Chemie GmbH.

(Antioxidant)

A polymeric piezoelectric film according to the present embodiment may contain an antioxidant. The antioxidant is preferably at least one selected from the group consisting of a hindered phenol-based compound, a hindered amine-based compound, a phosphite-based compound, and a thioether-based compound.

For the antioxidant, a hindered phenol-based compound or a hindered amine-based compound is more preferably used. By this, a polymeric piezoelectric film having excellent moisture and heat resistance and transparency can be provided.

(Other Components)

A polymeric piezoelectric film of the present embodiment may contain, to the extent that the advantage of the invention be not compromised, known resins, as represented by polyvinylidene fluoride, a polyethylene resin and a polystyrene resin, inorganic fillers, such as silica, hydroxyapatite, and montmorillonite, publicly known crystal nucleating agents such as phthalocyanine, and other components.

When a polymeric piezoelectric film contains a component other than a helical chiral polymer (A), the content of the component other than a helical chiral polymer (A) with respect to the total mass of polymeric piezoelectric film is preferably 20% by mass or less, and more preferably 10% by mass or less.

To the extent that the advantage of the invention is not compromised, a polymeric piezoelectric film of the present embodiment may contain a helical chiral polymer other than the afore-described helical chiral polymer (A) (namely, a helical chiral polymer (A) having a weight average molecular weight (Mw) from 50,000 to 1,000,000 and having optical activity).

From a viewpoint of transparency, the polymeric piezoelectric film preferably does not contain a component other than an optically active helical chiral polymer (A).

[Crystallinity]

The crystallinity of a polymeric piezoelectric film is determined by a DSC method, and the crystallinity of a polymeric piezoelectric film is from 20% to 80%, and preferably from 30% to 70%, and more preferably from 35% to 60%. When the crystallinity is in the above range, a favorable balance between the piezoelectricity, the transparency, and the longitudinal tear strength of a polymeric piezoelectric film is attained, and whitening or a break is less likely to occur during stretching, and therefore, the polymeric piezoelectric film is easily manufactured.

When the crystallinity is 20% or more, the piezoelectricity of a polymeric piezoelectric film is maintained high.

When the crystallinity is 80% or less, deterioration of the longitudinal tear strength and transparency can be suppressed.

For example, by adjusting conditions of crystallization and stretching during production of a polymeric piezoelectric film, the crystallinity of the polymeric piezoelectric film can be adjusted to from 20% to 80%.

[Standardized Molecular Orientation MORc]

The standardized molecular orientation MORc of a polymeric piezoelectric film is from 3.5 to 15.0. The standardized molecular orientation MORc is a value determined based on a "degree of molecular orientation MOR" which is an index indicating the degree of orientation of a helical chiral polymer (A). When the standardized molecular orientation MORc is 3.5 or more, there are many molecular chains (for example, polylactic acidmolecular chains) of helical chiral polymers (A) aligned in the stretching direction, and as a result, the rate of oriented crystals generated increases, whereby the polymeric piezoelectric film exhibits a higher piezoelectricity. When the standardized molecular orientation MORc is 15.0 or less, the longitudinal tear strength of the polymeric piezoelectric film further increases.

Here, the degree of molecular orientation MOR (Molecular Orientation Ratio) is measured by the following microwave measurement method. Namely, the polymeric piezoelectric film is placed in a microwave resonant waveguide of a well known microwave transmission-type molecular orientation meter (also referred to as a "microwave molecular orientation ratio measuring apparatus") such that the polymeric piezoelectric film plane (film plane) is arranged perpendicular to the travelling direction of the microwaves. Then, the polymeric piezoelectric film is continuously irradiated with microwaves whose oscillating direction is biased unidirectionally, while maintaining such conditions, the sample is rotated in a plane perpendicular to the travelling direction of the microwaves from 0 to 360', and the intensity of the microwaves passed through the sample is measured to determine the molecular orientation ratio MOR.

The standardized molecular orientation MORc means a degree of molecular orientation MOR obtained based on the reference thickness tc of 50 μm, and can be determined by the following formula $$MORc=(Tc/t)\times(MOR-1)+1$$

(tc: reference thickness to which the thickness should be corrected; t: thickness of polymeric piezoelectric film)

The standardized molecular orientation MORc can be measured by a known molecular orientation meter, for example, a microwave molecular orientation meter MOA-2012A or MOA-6000 manufactured by Oji Scientific Instruments, at a resonance frequency around 4 GHz or 12 GHz.

The polymeric piezoelectric film has a standardized molecular orientation MORc of from 3.5 to 15.0, preferably from 4.0 to 15.0, more preferably from 4.0 to 10.0, and further preferably from 4.0 to 8.0.

From a viewpoint of further improving adherence between a polymeric piezoelectric film and an intermediate layer, the standardized molecular orientation MORc is preferably 7.0 or less.

When the polymeric piezoelectric film is, for example, a stretched film, the standardized molecular orientation MORc can be controlled by heat treatment conditions (heating temperature and heating time) before stretching, stretching conditions (stretching temperature and stretching speed), or the like.

The standardized molecular orientation MORc can be converted to birefringence Δn which is obtained by dividing a phase difference amount (retardation) by a film thickness. Specifically, the retardation can be measured by a RETS100 manufactured by Otsuka Electronics Co., Ltd. MORc and Δn are approximately in a linearly proportional relationship. When Δn is 0, MORc is 1.

For example, when the helical chiral polymer (A) is a polylactic acid-type polymer and when the birefringence Δn of the polymeric piezoelectric film is measured at measurement wavelength of 550 nm, a standardized molecular orientation MORc of 2.0 can be converted to the birefringence Δn of 0.005, and a standardized molecular orientation MORc of 4.0 can be converted to the birefringence Δn of 0.01.

[Product of Standardized Molecular Orientation MORc and Crystallinity]

In the present embodiment, a product of the crystallinity and the standardized molecular orientation MORc of a polymeric piezoelectric film is preferably from 75 to 700. When the product is adjusted within the above range, the balance between the piezoelectricity and the transparency of a polymeric piezoelectric film is favorable, and the dimensional stability is high, and deterioration of longitudinal tear strength (that is, tear strength in a certain direction) is suppressed.

The product of the standardized molecular orientation MORc and the crystallinity of a polymeric piezoelectric film is more preferably from 75 to 600, further preferably from 100 to 500, particularly preferably from 125 to 400, and particularly preferably from 150 to 300, The product can be adjusted within the above range, for example, by adjusting the conditions of crystallization and stretching when the polymeric piezoelectric film is manufactured.

The standardized molecular orientation MORc can be controlled by conditions (for example, heating temperature and heating time) of crystallization and conditions (for example, stretching temperature and stretching speed) of stretching when a polymeric piezoelectric film is manufactured.

[Piezoelectric Constant $d_{14}$ (Stress-Electric Charge Method)]

The piezoelectricity of a polymeric piezoelectric film can be evaluated by, for example, measuring the piezoelectric constant $d_{14}$ of the polymeric piezoelectric film.

In the following, one example of a method of measuring the piezoelectric constant $d_{14}$ by a stress-electric charge method will be described.

First, a polymeric piezoelectric film is cut to a length of 150 mm in the direction of 45° with respect to the stretching direction (MD direction), and to 50 mm in the direction perpendicular to the above 45° direction, to prepare a rectangular specimen. Subsequently, the prepared specimen is set on a stage of Showa Shinku SIP-600, and aluminum (hereinafter, referred to as "Al") is deposited on one surface of the specimen such that the deposition thickness of Al becomes about 50 nm. Subsequently, Al is deposited on the other surface of the specimen similarly, Both surfaces of the specimen are covered with Al to form conductive layers of Al.

The specimen of 150 mm×50 mm having the Al conductive layers formed on both surfaces is cut to a length of 120 mm in the direction of 45° with respect to the stretching direction (MD direction) of the polymeric piezoelectric film, and to a length of 10 mm in the direction perpendicular to the above 45° direction, to cut out a rectangular film of 120 mm 10 mm. This film is used as a sample for measuring a piezoelectric constant.

The sample thus obtained is set in a tensile testing machine (TENSILON RTG-1250 manufactured by A&D Company, Limited) having a distance between chucks, of 70 mm so as not to be slack. A force is applied periodically at a crosshead speed of 5 min/min such that the applied force reciprocates between 4 N and 9 N. In order to measure a charge amount generated in the sample according to the applied force at this time, a capacitor having an electrostatic capacity Qm (F) is connected in parallel to the sample, and a voltage V between the terminals of this capacitor Cm (95 nF) is measured through a buffer amplifier. The above measurement is performed under a temperature condition of 25° C. A generated charge amount Q (C) is calculated as a product of the capacitor capacity Cm and a voltage Vm between the terminals. The piezoelectric constant $d_{14}$ is calculated by the following formula.

$$d_{14}=(2\times t)/L\times Cm\cdot \Delta Vm/\Delta F$$

t: sample thickness (m)

distance between chucks (m)

Cm: capacity (F) of capacitor connected in parallel

ΔVm/ΔF: ratio of change amount of voltage between terminals of capacitor with respect to change amount of force A higher piezoelectric constant $d_{14}$ results in a larger displacement of the polymeric piezoelectric film with respect to a voltage applied to the polymeric piezoelectric film, and reversely a higher voltage generated responding to a force applied to the polymeric piezoelectric film, and therefore is advantageous as a polymeric piezoelectric film.

Specifically, in the polymeric piezoelectric film according to the invention, the piezoelectric constant $d_{14}$ measured at 25° C. by a stress-charge method is preferably 1 pC/N or more, more preferably 3 pC/N or more, further preferably 5 pC/N or more, and particularly preferably 6 pC/N or more. The upper limit of the piezoelectric constant $d_{14}$ is not particularly limited, and is preferably 50 pC/N or less, and more preferably 30 pC/N or less, for a polymeric piezoelectric film using a helical chiral polymer from a viewpoint of a balance with transparency, or the like.

Similarly, from a viewpoint of the balance with transparency, the piezoelectric constant $d_{14}$ measured by a resonance method is preferably 15 pC/N or less.

[Transparency (Internal Haze)]

Transparency of a polymeric piezoelectric film can be evaluated, for example, by visual observation or measurement of haze. Internal haze for visible light (hereinafter, also simply referred to as "internal haze") of the polymeric piezoelectric film of the present embodiment is preferably 50% or less, more preferably 20% or less, still more preferably 13% or less, still more preferably 5% or less, particularly preferably 2.0% or less, and most preferably 1.0% or less.

The lower internal haze of the polymeric piezoelectric film is, the better the polymeric piezoelectric film is. From a viewpoint of the balance with the piezoelectric constant, or the like, internal haze is preferably from 0.01% to 15%, more preferably from 0.01% to 10%, further preferably from 0.1% to 5%, and particularly preferably from 0.1% to 1.0%.

In the present embodiment, the "internal haze" refers to a haze from which a haze caused by the shape of an external surface of the polymeric piezoelectric film is excluded.

The "internal haze" herein refers to a value measured with respect to a polymeric piezoelectric film at 25° C. in accordance with JIS-K7105.

More specifically, internal haze (hereinafter, also referred to as "internal haze H1") refers to a value measured as follows.

That is, first, for a cell having an optical path length of 10 mm filled with a silicone oil, a haze (hereinafter, also referred to as "haze H2") in the optical path length direction was measured. Next, a polymeric piezoelectric film of the present embodiment is immersed in the silicone oil of the cell such that the optical path length direction of the cell is in parallel with the normal direction of the film, and a haze (hereinafter, also referred to as "haze H3") in the optical path length direction of a cell in which the polymeric piezoelectric film is immersed. The haze H2 and the haze H3 are both measured at 25° C. in accordance with JIS-K7105.

Internal haze H1 is determined in accordance with the following formula based on the measured haze H2 and haze H3.

Internal haze($H1$)=Haze($H3$)−Haze($H2$)

Measurement of the haze H2 and the haze H3 can be performed by using, for example, a haze measuring machine [TC-HIII DPK manufactured by Tokyo Denshoku Co., Ltd.,].

For the silicone oil, for example, "Shin-Etsu Silicone (trade mark), model number: KF-96-100CS" manufactured by Shin-Etsu Chemical Co., Ltd. can be used.

[Tear Strength]

The tear strength (longitudinal tear strength) of a polymeric piezoelectric film of the present embodiment is evaluated based on the tear strength measured according to the "Right angled tear method" stipulated in JIS K 7128-3 "Plastics—Tear strength of films and sheets".

Here, the crosshead speed of a tensile testing machine is set at 200 mm/min and tear strength is calculated according to the following formula:

$T=F/d$ wherein T stands for the tear strength (N/mm), for the maximum tear load, and d for the thickness (mm) of a specimen.

The thickness of a polymeric piezoelectric film of the present embodiment is not particularly restricted, and is preferably from 10 μm to 400 μm, more preferably from 20 μm to 200 μm, further preferably from 20 μm to 100 μm, and particularly preferably from 20 μm to 80 μm.

<Manufacturing Method of Polymeric Piezoelectric Film>

A manufacturing method of a polymeric piezoelectric film of the present embodiment is not particularly restricted as long as the method is a method in which a crystallinity can be adjusted to from 20% to 80%; a standardized molecular orientation MORc can be adjusted to from 3.5 to 15.0; and when a phase difference streak is evaluated by the following evaluation method A, per a length of 1,000 mm in the direction Y, the number of phase difference streaks with an evaluation value of 60 or more can be adjusted to 0, and the sum of the evaluation values of phase difference streaks with an evaluation value of 20 or more can be adjusted to 1000 or less.

A polymeric piezoelectric film of the present embodiment can be suitably manufactured by using, as this method, a method including a step of forming a raw material of a polymeric piezoelectric film into a film and a step of stretching the formed film. Examples of the manufacturing method include one described in paragraphs 0065 to 0099 of WO 2013/054918,

[Molding Step]

In a molding step, a composition containing a helical chiral polymer (A) and, as needed, other components such as a stabilizer (B) is heated to a temperature not lower than the melting point Tm (° C.) of the helical chiral polymer (A) and molded in a film shape. By this molding step, a film containing the helical chiral polymer (A) and, as needed, other components such as the stabilizer (B) is obtained.

Herein, the melting point Tm (° C.) of a helical chiral polymer (A) and the glass transition temperature (Tg) of a helical chiral polymer (A) are values respectively obtained from a melting endothermic curve obtained by raising the temperature of the helical chiral polymer (A) under the condition of a heating rate of 10° C./min using a differential scanning calorimeter (DSC). The melting point (Tin) is a value obtained as a peak value of an endothermic reaction. The glass transition temperature (Tg) is a value obtained as an inflection point of the melting endothermic curve.

The above composition can be manufactured by mixing a helical chiral polymer (A) and, as needed, other components such as a stabilizer (B).

Here, the helical chiral polymer (A), the stabilizer (B), and the other components may be individually used singly, or two or more kinds thereof may be used.

The above mixing may be melt kneading.

Specifically, the composition may be manufactured by charging a helical chiral polymer (A) and, as needed, other components such as a stabilizer (B) into a melt-kneader [for example, Labo Plastomill manufactured by Toyo Seiki Seisaku-sho, Ltd.] and heating the mixture to a temperature not lower than the melting point of the helical chiral polymer (A), and melt kneading the mixture. In this case, a composition which has been manufactured by heating to a temperature not lower than the melting point of the helical chiral polymer (A) and melt kneading is formed into a film shape while maintaining the composition at a temperature not lower than the melting point of the helical chiral polymer (A).

Examples of conditions for melt kneading include conditions of a mixer rotation speed of 30 rpm to 70 rpm, a temperature of 180° C. to 250° C., and a kneading time of 5 minutes to 20 minutes.

In the molding step, as a method for forming a composition into a film, a molding method by melt extrusion molding, press molding, injection molding, calendar molding, casting method is used. A composition may be formed into a film shape by a T-die extrusion molding method or the like.

When a composition is formed into a film shape by a T-die extrusion molding method, by adjusting the extrusion temperature and the lip tip edge radius of the T-die, an evaluation value of a phase difference streak and the sum of evaluation values of phase difference streaks of a polymeric piezoelectric film of the present embodiment can be adjusted. For example, the extrusion temperature is preferably adjusted to from 200° C. to 230° C., more preferably to from 210° C. to 225° C., and the lip tip edge radius of the T-die is preferably adjusted to from 0.001 mm to 0.100 mm, and more preferably from 0.001 mm to 0.050 mm.

In the molding step, a composition may be heated to the above temperature and formed into a film, and the obtained film may be quenched. By quenching, the crystallinity of the film obtained in this step can be adjusted.

Here, the term "quenching" refers to cooling to at least not higher than the glass transition temperature Tg of the helical chiral polymer (A) immediately after extrusion.

In the present embodiment, it is preferable that other processes are not included between molding into a film and quenching.

Examples of a method of quenching include: a method of immersing a film in a coolant such as water, ice water, ethanol, ethanol or ethanol containing dry ice, liquid nitrogen or the like; and a method of spraying a liquid spray having a low vapor pressure onto a film and cooling the film by latent heat of vaporization.

In order to continuously cool the film, it is also possible to rapidly cool the film by contacting the film with a metal roll controlled to a temperature not higher than the glass transition temperature Tg of the helical chiral polymer (A).

The number of times of cooling may be only once or two or more times.

The film obtained in a molding step (in other words, a film to be subjected to a stretching step described below) may be a film in an amorphous state or a preliminarily crystallized film (hereinafter, also referred to as a "pre-crystallized film")

Here, the amorphous state film means a film having a crystallinity of less than 3%.

The pre-crystallized film means a film having a crystallinity of 3% or more (preferably from 3% to 70%).

Here, the crystallinity refers to a value measured by a method similar to the crystallinity of a polymeric piezoelectric film.

The thickness of a film (amorphous state film or pre-crystallized film) obtained in the molding step is mainly determined by the thickness of the polymeric piezoelectric film finally obtained and the stretching ratio, but is preferably from 50 μm to 1,000 μm, and more preferably about from 100 μm to 800 μm.

The pre-crystallized film can be obtained by heat-treating an amorphous film containing a helical chiral polymer (A) and, as needed, other components such as a stabilizer (B), and crystallization.

The heating temperature T for preliminarily crystallizing an amorphous film is not particularly limited, and, from a viewpoint of enhancing the piezoelectricity and transparency of a polymeric piezoelectric film to be manufactured, it is preferable that the relationship between the glass transition temperature Tg of a helical chiral polymer (A) and the following formula is satisfied and the crystallinity is set to from 3% to 70%.

$$Tg-40° C. \leq T \leq Tg+40° C.$$

(Tg represents the glass transition temperature of the helical chiral polymer (A))

The heating time for preliminarily crystallizing an amorphous state film can be appropriately set in consideration of the standardized molecular orientation MORc and the crystallinity of an ultimately obtained polymeric piezoelectric film.

The heating time is preferably from 5 seconds to 60 minutes, and more preferably from 1 minute to 30 minutes from a viewpoint of stabilizing the manufacturing conditions. As the heating time becomes longer, the standardized molecular orientation MORc becomes higher and the crystallinity tends to become higher.

For example, in the case of preliminarily crystallizing a film in an amorphous state containing a polylactic acid polymer as the helical chiral polymer (A), it is preferable to perform heating at from 20° C. to 170° C. for 5 seconds to 60 minutes (preferably from 1 minute to 30 minutes).

In order to preliminarily crystallize an amorphous film, for example, a cast roll adjusted to the above temperature range can be used. By using the electrostatic adhesion method described above, the polymeric piezoelectric film is brought into close contact with a cast roll for preliminary crystallization, whereby it is possible to preliminarily crystallize and adjust the peak of the thickness. For example, in the case of adopting wire pinning to bring the entire surface of the film into close contact, the peak of the thickness can be adjusted by adjusting the position of the electrode, material, applied voltage, and the like.

[Stretching Process]

The stretching step is a step of stretching a film (for example, a pre-crystallized film) obtained in the molding step mainly in the uniaxial direction. By this step, a polymeric piezoelectric film having a large principal plane area can be obtained as a stretched film.

"The principal plane area is large" means that the area of the principal plane of a polymeric piezoelectric film is 5 mm$^2$ or more. The area of the principal plane is preferably 10 mm$^2$ or more.

It is presumed that, by stretching the film mainly in the uniaxial direction, molecular chains of a helical chiral polymer (A) contained in the film can be orientated in one direction and aligned at high density, thereby obtaining higher piezoelectricity, As a method of stretching uniaxially in a continuous process, either longitudinal stretching in which the flow direction (MD direction) of the process and the stretching direction coincide or transverse stretching in which the direction (TD direction) perpendicular to the flow direction of the process and the stretching direction coincide may be used.

In the case of stretching a film only by a tensile force such as by stretching in the uniaxial direction, the stretching temperature of the film is preferably in the range of about from 10° C. to 20° C. higher than the glass transition temperature of the film (or a helical chiral polymer (A) in the film).

The stretching ratio in the stretching treatment is preferably from two to ten times, more preferably from three to five times, and further preferably from three to four times. By this, a polymeric piezoelectric film having higher piezoelectricity and transparency can be obtained.

In a stretching step, when stretching (main stretching) for enhancing piezoelectricity is performed, a film (for example, a pre-crystallized film) obtained in the molding step may be stretched (also referred to as secondary stretching) simultaneously or successively in a direction crossing (preferably perpendicular to) the direction of the main stretching.

Herein, "successive stretching" means a stretching method, by which a sheet is first stretched in a uniaxial direction, and then stretched in a direction crossing the first stretching direction.

When secondary stretching is performed in a stretching step, the stretching magnification of secondary stretching is preferably from 1 time to 3 times, more preferably from 1.1 times to 2.5 times, and further preferably from 1.2 times to 2.0 times. By this, phase difference streaks generated in a polymeric piezoelectric film can be further reduced, and the tear strength can be further increased.

When a pre-crystallized film is stretched in a stretching step, the film may be preheated immediately before stretching so that the film can be easily stretched. Since the preheating is performed generally for the purpose of softening the film before stretching in order to facilitate the stretching, the same is normally performed avoiding conditions that promote crystallization of a film before stretching and make the film stiff. Meanwhile, as described above, in the present embodiment, pre-crystallization may be performed before stretching, and therefore the preheating may be performed combined with the pre-crystallization. Specifically, by conducting the preheating at a higher temperature than a temperature normally used, or for longer time conforming to the heating temperature or the heat treatment time at the pre-crystallized step, preheating and pre-crystallization can be combined.

[Annealing Step]

The manufacturing method of this embodiment may include an annealing as needed.

The annealing step is a step of annealing (heat treatment) a film (hereinafter also referred to as "stretched film") stretched in a stretching step. By the annealing step, crystallization of the stretched film can be further advanced, and a polymeric piezoelectric film having higher piezoelectricity can be obtained.

When the stretched film is crystallized mainly by annealing, the preliminary crystallization operation in the above molding step may be omitted. In this case, an amorphous film can be selected as a film (that is, a film to be subjected to a stretching step) obtained in the molding step.

In the present embodiment, the annealing temperature is preferably from 80° C. to 160° C., and more preferably from 100° C. to 155° C.

A method of annealing (heat treatment) is not particularly limited, and examples thereof include: a method in which a stretched film is directly heated by being in contact with a heating roll, or using a hot air heater or an infrared heater; and a method in which a stretched film is heated with a heated liquid (silicone oil or the like).

Annealing is preferably performed while applying a fixed tensile stress (for example, from 0.01 MPa to 100 MPa) to the stretched film in such a manner that the stretched film does not sag.

The annealing time is preferably from one second to five minutes, more preferably from 5 seconds to three minutes, and still more preferably from 10 seconds to two minutes. When the annealing time is five minutes or less, excellent productivity is obtained. On the other hand, when the annealing time is one second or more, the crystallinity of the film can be further improved.

An annealed stretched film (that is; a polymeric piezoelectric film) is preferably quenched after annealing. "Quenching" which may be carried out in the annealing step is similar to "rapid cooling" which may be carried out in the above molding step.

The number of times of cooling may be once, or two or more times, and it is also possible to alternately repeat annealing and cooling.

<Use of Polymeric Piezoelectric Film>

A polymeric piezoelectric film can be used in a variety of fields including a loudspeaker, a headphone, a touch panel, a remote controller, a microphone, a hydrophone, an ultrasonic transducer, an ultrasonic applied measurement instrument, a piezoelectric vibrator, a mechanical filter, a piezoelectric transformer, a delay unit, a sensor, an acceleration sensor, an impact sensor, a vibration sensor, a pressure-sensitive sensor; a tactile sensor, an electric field sensor, a sound pressure sensor, a display, a fan, a pump, a variable-focus mirror, a sound insulation material, a soundproof material, a keyboard, acoustic equipment, information processing equipment, measurement equipment, and a medical appliance, and from a viewpoint that a high sensor sensitivity can be maintained when the film is used for a device, a polymeric piezoelectric film is preferably utilized particularly in a field of variety of sensors.

A polymeric piezoelectric film can also be used as a touch panel formed by combining the polymeric piezoelectric film with a display device. For the display device, for example, a liquid crystal panel, an organic EL panel, or the like can also be used.

A polymeric piezoelectric film can also be used as a pressure-sensitive sensor, by combining the polymeric piezoelectric film with another type touch panel (position detecting member). Examples of the detection method of the position detecting member include an anti-film method, an electrostatic capacitance method, a surface acoustic wave method, an infrared method, and an optical method.

In this case, a polymeric piezoelectric film is preferably used as a piezoelectric element having at least two planes provided with electrodes. It is enough if the electrodes are provided on at least two planes of the polymeric piezoelectric film. There is no particular restriction on the electrode, and examples thereof to be used include ITO, ZnO, IZO (registered trade marks), IGZO, an electroconductive polymer, silver nanowire, and metal mesh.

A polymeric piezoelectric film and an electrode may be piled up one another and used as a layered piezoelectric element. For example, units of an electrode and a polymeric piezoelectric film are piled up recurrently and finally a principal plane of a polymeric piezoelectric film not covered by an electrode is covered by an electrode. Specifically, that with two recurrent units is a layered piezoelectric element having an electrode, a polymeric piezoelectric film, an electrode, a polymeric piezoelectric film, and an electrode in the mentioned order. With respect to a polymeric piezoelectric film to be used for a layered piezoelectric element, at least one layer of polymeric piezoelectric film is required to be made of a polymeric piezoelectric film of the present embodiment, and other layers may not be made of a polymeric piezoelectric film of the present embodiment.

In the case that plural polymeric piezoelectric films are included in a layered piezoelectric element, a helical chiral polymer (A) contained in a polymeric piezoelectric film in a layer has L-form optical activity, a helical chiral polymer (A) contained in a polymeric piezoelectric film in another layer may be either of L-form and D-form. The location of polymeric piezoelectric films may be adjusted appropriately according to an end use of a piezoelectric element.

For example, when the first layer of a polymeric piezoelectric film containing as a main component an L-form helical chiral polymer is laminated intercalating an electrode with the second polymeric piezoelectric film containing as a main component an L-form helical chiral polymer (A), the uniaxial stretching direction (main stretching direction) of the first polymeric piezoelectric film should preferably cross, especially perpendicularly cross, the uniaxial stretching direction (main stretching direction) of the second polymeric piezoelectric film so that the displacement directions of the first polymeric piezoelectric film and the second polymeric piezoelectric film can be aligned, and that the piezoelectricity of a laminated piezoelectric element as a whole can be favorably enhanced.

On the other hand, when the first layer of a polymeric piezoelectric film containing as a main component an L-form helical chiral polymer (A) is laminated intercalating an electrode with the second polymeric piezoelectric film containing as a main component an D-form helical chiral polymer (A), the uniaxial stretching direction (main stretching direction) of the first polymeric piezoelectric film should preferably be arranged nearly parallel to the uniaxial stretching direction (main stretching direction) of the second polymeric piezoelectric film so that the displacement directions of the first polymeric piezoelectric film and the second polymeric piezoelectric film can be aligned, and that the piezoelectricity of a laminated piezoelectric element as a whole can be favorably enhanced.

Especially, when a principal plane of a polymeric piezoelectric film is provided with an electrode, it is preferable to provide a transparent electrode. In this regard, a transparent electrode means specifically that its internal haze is 40% or less (total luminous transmittance is 60% or more).

The piezoelectric element using a polymeric piezoelectric film of the invention may be applied to the aforementioned various piezoelectric devices including a loudspeaker and a touch panel. A piezoelectric element provided with a transparent electrode is favorable for applications, such as a loudspeaker, a touch panel, and an actuator.

EXAMPLES

A polymeric piezoelectric film of the present invention will be described below in more details by way of Examples, provided that the present embodiment is not limited to the following Examples to the extent not to depart from the spirit of the present invention.

Example 1

As a helical chiral polymer (A), polylactic acid (product name: Ingeo™ biopolymer, brand name: 4032D) manufactured by NatureWorks LLC was prepared, 1.0 part by mass of the following additive X (stabilizer (B)) was added to 100 parts by mass of the polylactic acid and dry blended to prepare a raw material.

The prepared raw material was placed in an extruder hopper and extruded from a 2,000 mm wide T-die (lip tip edge radius 0.030 mm) while being heated to 230° C. and brought into contact with a 50° C. cast roll for 0.5 min to form a pre-crystallized film having a thickness of 150 μm (molding step).

Stretching of the obtained pre-crystallized film was started at a stretching speed of 1,650 mm/min by roll-to-roll while the film was heated by being in contact with a roll heated at 70° C., and the film was stretched up to 3.5-fold uniaxially in the MD direction to obtain a uniaxially stretched film (stretching step).

Thereafter, the uniaxially stretched film was brought into contact with a roll heated to 130° C. by roll-to-roll for 78 seconds, and then quenched by a roll set to 50° C. Both end portions in the film width direction were evenly slit and then cut off to obtain a film having a width of 1,000 mm. The film was then wound into a roll shape to obtain a polymeric piezoelectric film (annealing step).

—Additive X (Stabilizer (B))—

In Example 1, as the additive X, a mixture of Stabaxol P400 (10 parts by mass) manufactured by Rhein Chemie GmbH, Stabaxol I (80 parts by mass) manufactured by Rhein Chemie GmbH, and CARBODILITE LA-1 (10 parts by mass) manufactured by Nisshinbo Chemical Inc. was used.

Details of the components in the above mixture are as follows.

Stabaxol P400 . . . poly(1,3,5-triisopropylphenylene-2,4-carbodiimide) (weight average molecular weight: 20,000)

Stabaxol I . . . bis-2,6-diisopropylphenyl carbodiimide (molecular weight (=weight average molecular weight): 363)

Carbodilite LA-1 . . . poly(4,4'-dicyclohexylmethane carbodiimide) (weight average molecular weight: about 2,000)

Example 2

A polymeric piezoelectric film was obtained in the same manner as in Example 1 except that the extrusion temperature 230° C. from the T-die was changed to 220° C.

Example 3

A polymeric piezoelectric film was obtained in the same manner as in Example 1 except that a T-die having a lip tip edge radius of 0.030 mm was changed to a T-die having a lip tip edge radius of 0.003 mm.

Comparative Example 1

A polymeric piezoelectric film was obtained in the same manner as in Example 1 except that the T-die having a lip tip edge radius of 0.030 mm was changed to a T-die having a lip tip edge radius of 0.300 mm.

The physical property values of polylactic acid used in Examples 1 to 3 and Comparative Example 1 are as illustrated in the following Table 1.

TABLE 1

| Polylactic acid-type resin | | | | |
|---|---|---|---|---|
| Resin | Chirality | Mw | Mw/Mn | Optical purity (% ee) |
| LA | L | 200,000 | 1.87 | 97.0 |

—Measurement of Amounts of L-form and D-form of Polylactic Acid—

Into a 50 mL Erlenmeyer flask, 1.0 g of a weighed-out sample (polymeric piezoelectric film) was charged, to which 2.5 mL of IPA (isopropyl alcohol) and 5 mL of a 5.0 mol/L sodium hydroxide solution were added. The Erlenmeyer flask containing the sample solution was then placed in a water bath at the temperature of 40° C., and stirred until polylactic acid was completely hydrolyzed for about 5 hours.

After the sample solution was cooled down to room temperature, 20 mL of a 1.0 mol/L hydrochloric acid solution was added for neutralization, and the Erlenmeyer flask was stoppered tightly and stirred well. The sample solution (1.0 mL) was dispensed into a 25 mL measuring flask and diluted to 25 mL with a mobile phase to prepare a HPLC sample solution 1. Into an HPLC apparatus 5 μL of the HPLC sample solution 1 was injected, and D/L-form peak areas of polylactic acid were determined under the following HPLC conditions. The amounts of L-form and D-form were calculated therefrom.

—HPLC Measurement Conditions—

Column:

Optical resolution column, SUMICHIRAL OA5000 (manufactured by Sumika Chemical Analysis Service, Ltd.)

Measuring Apparatus:

Liquid chromatography (manufactured by Jasca Corporation)

Column temperature:

25° C.

Mobile Phase:

1.0 mM-copper (II) sulfate buffer solution/IPA=98/2 (V/V)

Copper (II) sulfate/IPA/water=156.4 mg/20 mL/980 mL

Mobile Phase Flow Rate:

Detector:

Ultraviolet detector (UV 254 nm)

—Molecular Weight Distribution—

The molecular weight distribution (Mw/Mn) of a polylactic acid used in manufacturing each polymeric piezoelectric film of Examples 1 to 3 and Comparative Example 1 was measured using a gel permeation chromatograph (GPC) by the following GPC measuring method.

—GPC Measuring Method—

Measuring apparatus:

GPC-100 (manufactured by Waters) s

Column:

SHODEX LF-804 (manufactured by Showa Denko K.K.)

Preparation of Sample:

Each polymeric piezoelectric film of Examples 1 to 3 and Comparative Example 1 was dissolved in a solvent (chloroform) at 40° C. to prepare a sample solution with the concentration of 1 mg/mL.

Measuring Conditions:

0.1 mL of a sample solution was introduced into the column at a temperature of 40° C. and a flow rate of 1 mL/min by using chloroform as a solvent, and the concentration of the sample that was contained in the sample solution and separated by the column was measured by a differential refractometer. With respect to the molecular weight of a polylactic acid, a universal calibration curve was prepared using polystyrene standard samples, and the weight average molecular weight (Mw) for each polylactic acid was calculated therefrom.

<Measurement of Physical Properties and Evaluation>

With respect to the polymeric piezoelectric films of Examples 1 to 3 and Comparative Example 1 obtained as described above, the phase difference streaks were evaluated by appearance and evaluation method A described below, the number of peak A and peak B, non-contact three-dimensional surface roughness, tear strength, piezoelectric constant ($d_{14}$), modulus of elasticity (45° elastic modulus in 45° direction), elongation at break in 45° direction (45° elongation at break), crystallinity, MORc, and internal haze were measured. Evaluation results and measurement results are listed in Table 2.

[Internal Haze]

"Internal haze" means herein the internal haze of a polymeric piezoelectric film according to the present invention, and measured by the following method.

Specifically, internal haze (hereinafter also referred to as "internal haze (H1)") of each polymeric piezoelectric film of Examples 1 to 3 and Comparative Example 1 was measured by measuring the light transmittance in the thickness direction. More precisely, the haze (1-12) was measured by placing in advance only a silicone oil (Shin-Etsu Silicone (trade mark), grade: KF-96-100CS; by Shin-Etsu Chemical Co., between 2 glass plates; then the haze (H3) was measured by placing a film (polymeric piezoelectric film), whose surfaces were wetted uniformly with the silicone oil, between two glass plates; and finally internal haze (H1) of each polymeric piezoelectric film of Examples 1 to 3 and Comparative Example 1 was obtained by calculating the difference between the above two according to the following formula:

Internal haze($H1$)=haze−haze($H2$)

The haze (1-12) and haze (H3) in the above formula were determined by measuring the light transmittance in the thickness direction using the following apparatus under the following measuring conditions.

Measuring apparatus: HAZE METER TC-HIII DPK(by Tokyo Denshoku Co., Ltd.)

Sample size: Width 30 mm×length 30 mm

Measuring conditions: According to JIS-K7105

Measuring temperature: Room temperature (25° C.)

[Piezoelectric Constant $d_{14}$ (Stress-Electric Charge Method)] In accordance with "one example of a method of measuring the piezoelectric constant $d_{14}$ by a stress-electric charge method" described above, the piezoelectric constant (particularly, piezoelectric constant $d_{14}$ (stress-electric charge method)) of a crystallized polymer film was measured.

[Standardized Molecular Orientation MORc]

Standardized molecular orientation MORc was measured for each of polyene piezoelectric films of Examples 1 to 3 and Comparative Example 1 by a microwave molecular orientation meter MOA-6000 by Oji Scientific Instruments. The reference thickness tc was set at 50 μm.

[Melting Point Tm and Crystallinity]

10 mg of each polymeric piezoelectric film of Examples 1 to 3 and Comparative Example 1 was weighed accurately and measured by a differential scanning calorimeter (DSC-1, manufactured by Perkin Elmer Inc.) at a temperature increase rate of 10° C./min to obtain a melting endothermic curve. From the obtained melting endothermic curve, the crystallinity was obtained.

[Tear Strength]

With respect to each of polymeric piezoelectric films of Examples 1 to 3 and Comparative Example 1, the tear strength in the MD direction (longitudinal tear strength) was measured according to the "Right angled tear method" stipulated in JIS K 7128-3 "Plastics—Tear strength of films and sheets".

In these examples, when the tear strength in the MI) direction is high, it means that deterioration of the longitudinal tear strength is suppressed.

In the measurement of the tear strength, the crosshead speed of a tensile testing machine was set at 200 mm/min.

The tear strength (T) was calculated according to the following formula:

$T=F/d$ wherein T stands for the tear strength (N/mm), F for the maximum tear load, and d for the thickness (mm) of a specimen.

[Modulus of Elasticity, Elongation at Break]

For a rectangular specimen obtained by cutting each polymeric piezoelectric film of Examples 1 to 3 and Comparative Example 1 to 180 mm in a direction of 45° with respect to the stretching direction (MD direction) and to 10 mm in a direction perpendicular to the above 45° direction, the modulus of elasticity, and elongation at break in the 45° direction were measured by using a tensile testing machine STROGRAPH VD1E manufactured by Toyo Seiki Seisaku-Sho, Ltd. in accordance with JIS-K-7127.

[Appearance]

The appearance of each polymeric piezoelectric film of Examples 1 to 3 and Comparative Example 1 was evaluated by the degree of brightness of light when light is made incident from the direction perpendicular to the main surface of the film and the emitted light is projected on the screen and observed. Specifically, the appearance was evaluated according to the following criteria.

A: Bright and dark streaks of light can hardly be recognized

B: Several bright and dark streaky lights can be observed

C: Streaky light can be observed on the whole surface

[Phase Difference Streak]

With respect to each of the polymeric piezoelectric films (thickness: 50 μm) of Examples 1 to 3 and Comparative Example 1, a wide range birefringence evaluation system "WPA-100" manufactured by Photonic Lattice was used to evaluate phase difference streaks by the following evaluation method A. Evaluation method A was carried out by the following procedures (a) to (d).

Figure 2:
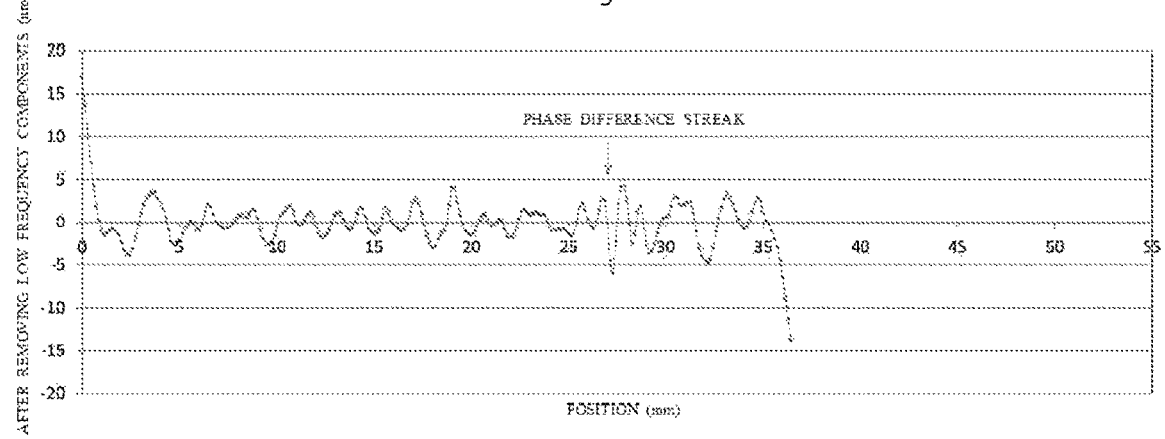
FIG. 2 is a graph illustrating an in-plane phase difference profile of a film after inverse Fourier transformation (after removal of low frequency components) of the polymeric piezoelectric film of Comparative Example 1.
Figure 3:
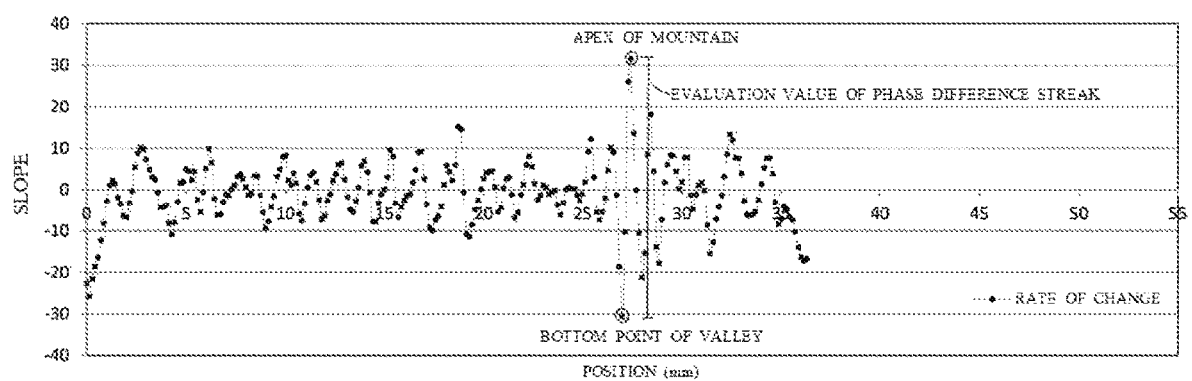
FIG. 3 is a graph illustrating a slope profile of the polymeric piezoelectric film of Comparative Example 1.

(a) With respect to the direction Y, in-plane phase difference data of a film was acquired at intervals of 0.143 mm to obtain an in-plane phase difference profile. FIG. 1 is a graph illustrating the in-plane phase difference profile of a film obtained for the polymeric piezoelectric film of Comparative Example 1 (from the end portion to the position of 55 mm).
(b) The obtained in-plane phase difference profile was subjected to Fast Fourier Transform, low frequency components were removed with a cutoff frequency of 0.273/mm, and then inverse Fourier transform was performed. FIG. 2 is a graph illustrating an in-plane phase difference profile of the film after inverse Fourier transformation (after removal of low frequency components) of the polymeric piezoelectric film of Comparative Example 1.
(c) For the in-plane phase difference profile after inverse Fourier transformation, slopes of two adjacent points were calculated and converted into a slope profile. FIG. 3 is a graph illustrating a slope profile of the polymeric piezoelectric film of Comparative Example 1.
(d) The height from the bottom point of a valley of the obtained slope profile to the apex of the mountain adjacent to the valley was taken as an evaluation value of a phase difference streak.

Figure 4:
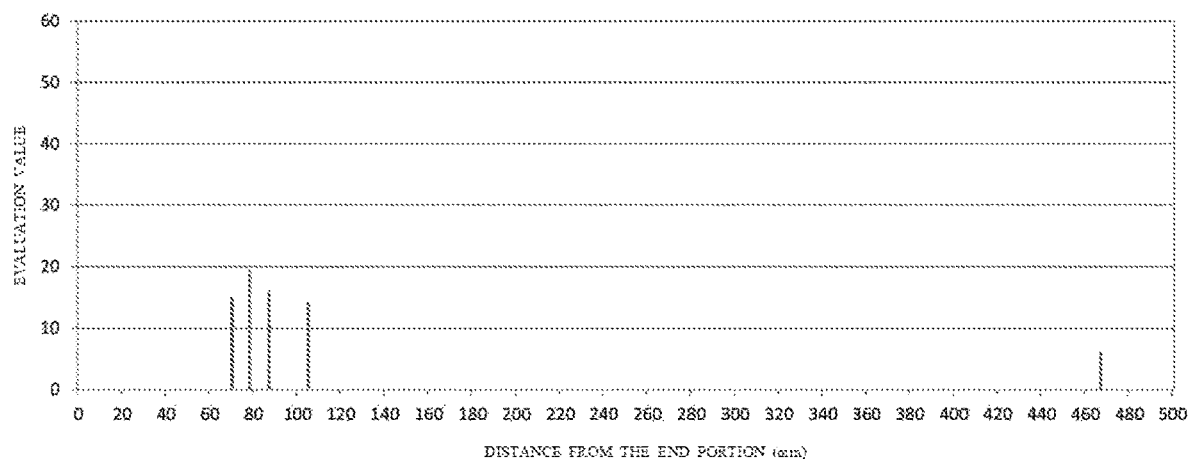
FIG. 4 is a graph illustrating evaluation values of phase difference streaks for a polymeric piezoelectric film of Example 2.
Figure 5:
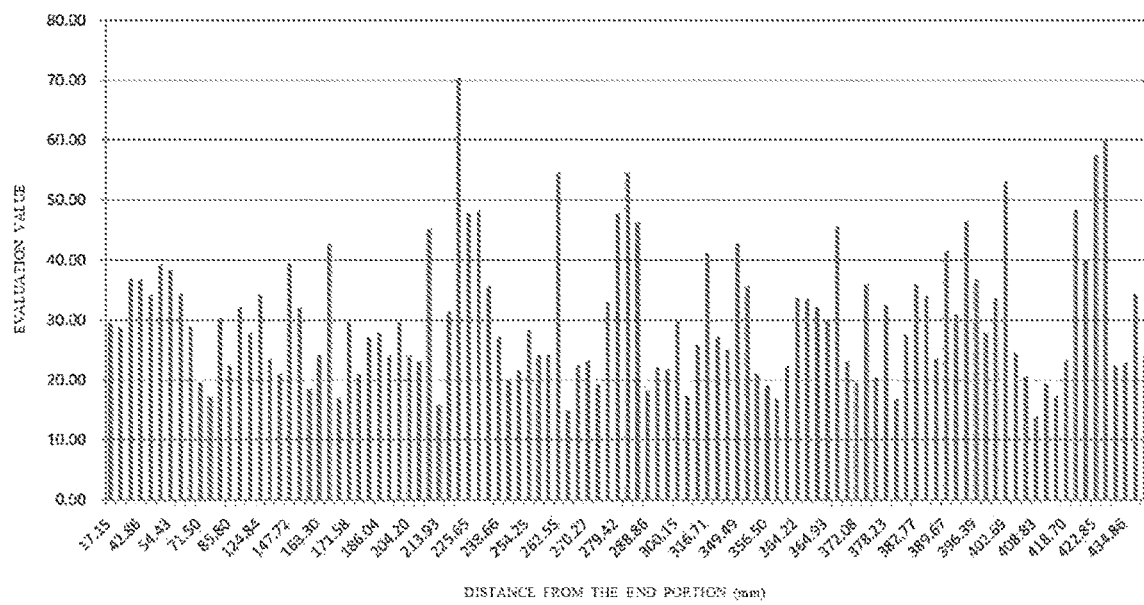
FIG. 5 is a graph illustrating evaluation values of phase difference streaks for a polymeric piezoelectric film of Comparative Example 1.

FIGS. 4 and 5 are graphs illustrating evaluation values of phase difference streaks for the polymeric piezoelectric films of Example 2 and Comparative Example 1. As can be seen from the graphs of FIGS. 4 and 5, in Comparative Example 1, many phase difference streaks were observed, whereas in Example 2, phase difference streaks were greatly reduced, and almost no phase difference streaks were observed.

[Non-Contact Three-Dimensional Surface Roughness]

Non-contact three-dimensional surface roughness Sa of each of the polymeric piezoelectric films of Examples 1 to 3 and Comparative Example 1 was measured by the following method.

First, after platinum was sputtered on the measurement surface of the polymeric piezoelectric film using sputtering apparatus (J-1000 manufactured by ULVAC, Inc.), image analysis within an area of 645 μm×644 μm was performed using confocal laser microscope (LEXT OLS 4000 manufactured by Olympus Corporation, objective lens×20), and as a result, non-contact three-dimensional surface roughness Sa was calculated in accordance with ISO 25178. Specifically, this measurement was carried out at three points in the film measurement plane, and the average value was taken as noncontact three-dimensional surface roughness Sa.

[Measurement of Thickness Peak]

Next, in order to check the undulation (thickness unevenness) of each of the polymeric piezoelectric films of Examples 1 to 3 and Comparative Example 1, the thickness peak per 1,000 mm in the Y direction was determined as follows.

A thickness peak was determined by using an inline film thickness meter.

When the thickness of a polymeric piezoelectric film was measured, a waveform representing the relationship between a position of the film in the width direction and a thickness of the film was detected by an inline film thickness meter.

A waveform between a position of a film in the width direction corresponding to the vertex of a convex portion and a position of the film in the width direction corresponding to the vertex of a concave portion decreasing from the vertex of the convex portion (or between the position of a film in the width direction corresponding to the vertex of a concave portion and the position of the film in the width direction corresponding to the vertex of a convex portion increasing from the vertex of the cancave portion) was set as one peak unit.

A difference between the thickness corresponding to the vertex of the convex portion (or the concave portion) and the thickness corresponding to the vertex of the concave portion (or the convex portion) was measured to calculate the peak height.

A distance between a position of the film in the width direction corresponding to the vertex of a convex portion (or a concave portion) and a position of the film in the width direction corresponding to the vertex of a concave portion (or a convex portion) measured to calculate the peak-to-peak distance. A peak slope is then calculated by the following formula, and a peak slope is expressed as an absolute value.

|Peak slope|=(Peak height)/(Peak distance)   [Formula]:

A peak A and a peak B were determined according to the obtained peak height and peak slope, and the number of peaks A and peaks B in each of the polymeric piezoelectric films of Examples 1 to 3 and Comparative Example 1 was determined.

The peak A represents a peak having a peak height of 1.5 μm or more and the following peak slope (namely, a value obtained by dividing the peak height by the peak-to-peak distance) of 0.000035 or more. The peak B represents a peak having a peak height of 1.5 μm or more and a peak slope of 0.00008 or more.

TABLE 2

| | Phase difference streak/per length of 1,000 mm in direction Y | | | | | | Undulation | |
| --- | --- | --- | --- | --- | --- | --- | --- | --- |
| | Total number | Evaluation value of 60 or more | Evaluation value of from 40 to less than 60 | Evaluation value of from 20 to less than 40 | Evaluation value of less than 20 | Sum of evaluation value | Sum of evaluation values which is 20 or more | Peak A [/1000 mm] | Peak B [/1000 mm] |
| Example 1 | 42 | 0 | 0 | 6 | 36 | 658 | 158 | 12 | 5 |
| Example 2 | 10 | 0 | 0 | 0 | 10 | 140 | 0 | 10 | 3 |
| Example 3 | 5 | 0 | 0 | 0 | 5 | 63 | 0 | 9 | 2 |
| Comparative Example 1 | 210 | 4 | 32 | 142 | 32 | 6414 | 5848 | 14 | 5 |

Roughness

TABLE 2-continued

| | Three-dimensional surface roughness Sa [μm] | Appearance | Tear strength [N/mm] | $d_{14}$ [pC/N] | 45° elastic modulus [GPa] | 45° elongation at break [%] | $d_{14} \times 45°$ elastic modulus | Crystallinity [%] | MORc | Internal haze [%] |
|---|---|---|---|---|---|---|---|---|---|---|
| Example 1 | 0.093 | B | 174 | 6.4 | 3.6 | 8.1 | 23.0 | 37.7 | 4.7 | 0.2 |
| Example 2 | 0.095 | A | 181 | 6.5 | 3.6 | 7.6 | 23.4 | 36.7 | 4.8 | 0.2 |
| Example 3 | 0.097 | A | 178 | 6.4 | 3.6 | 7.5 | 23.0 | 35.9 | 4.8 | 0.2 |
| Comparative Example 1 | 0.091 | C | 87 | 6.2 | 3.4 | 3.1 | 21.1 | 38.4 | 4.6 | 0.2 |

As listed in Table 2, in Examples 1 to 3 in which the number of phase difference streaks having an evaluation value of 60 or more per 1,000 mm in length in the direction Y was 0 and the sum of evaluation values of the phase difference streaks having an evaluation value of 20 or more was 1,000 or less, as compared with Comparative Example 1 in which the number of phase difference streaks having an evaluation value of 60 or more per 1,000 mm in length in the direction Y was 1 or more and the sum of evaluation values of the phase difference streaks having an evaluation value of 20 or more was more than 1,000, the appearance was excellent, and the tear strength in the MD direction was large, and deteriorate in the longitudinal tear strength was suppressed. In other words, it was confirmed that by reducing phase difference streaks, the tearing property was improved.

Further, in Examples 1 to 3 and Comparative Example 1, there was hardly any difference between the confirmation result of the undulation and the measurement result of the roughness. Therefore, it was confirmed that the tearing property was improved by reducing the phase difference streak even when there was hardly any difference between the confirmation result of the undulation and the measurement result of the roughness.

In Examples 1 to 3, it was possible to make the values of the piezoelectric constant $d_{14}$, 45° elastic modulus and 45° elongation at break larger than those of Comparative Example 1, and it was possible to keep the value of the $d_{14} \times 45°$ elastic modulus which is a parameter of the sensor sensitivity larger than that of Comparative Example 1.

It was confirmed from Examples 1 and 2 that by lowering the extrusion temperature at the time of extruding a raw material from the T-die, it was possible to further reduce the phase difference streak and to further improve the tearing property.

From Examples 1 and 3 and Comparative Example 1, it was confirmed that it was possible to further reduce the phase difference streak by making the lip tip edge radius smaller.

The entire disclosure of Japanese Patent Applications No. 2015-026709 filed on Feb. 13, 2015 is incorporated herein by reference.

All publications, patent applications, and technical standards described in this specification are herein incorporated by reference to the same extent as if each individual publication, patent application, or technical standard was specifically and individually indicated to be incorporated by reference.

The invention claimed is:

1. A polymeric piezoelectric film, comprising a helical chiral polymer (A) having a weight average molecular weight of from 50,000 to 1,000,000 and optical activity, wherein, in the film:

a crystallinity given by a DSC method is from 20% to 80%;

a standardized molecular orientation MORc is from 3.5 to 15.0 when a reference thickness measured by a microwave transmission-type molecular orientation meter is 50 μm; and when a direction parallel to a phase difference streak is a direction X, a direction perpendicular to the direction X and parallel to a main plane of a film is a direction Y, and the phase difference streak is evaluated by an evaluation method A, per a length of 1,000 mm in the direction Y, a number of phase difference streaks with an evaluation value of 60 or more is 0, and a sum of evaluation values of phase difference streaks with an evaluation value of 20 or more is 1000 or less, the evaluation method A comprising:
(a) with respect to the direction Y, acquiring in-plane phase difference data of a film at intervals of 0.143 mm to obtain an in-plane phase difference profile;
(b) performing fast Fourier transformation on the obtained in-plane phase difference profile, removing low frequency components using 0.273/mm as a cutoff frequency, and then performing inverse Fourier transformation;
(c) calculating slopes of two adjacent points with respect to the in-plane phase difference profile after inverse Fourier transformation and converting the slopes into a slope profile; and
(d) taking a height from a bottom point of a valley of the obtained slope profile to an apex of a mountain adjacent to the valley as an evaluation value of a phase difference streak.

2. The polymeric piezoelectric film according to claim 1, wherein, when evaluated by the evaluation method A, per a length of 1,000 mm in the direction Y, a number of phase difference streaks with an evaluation value of 40 or more is 0, and a sum total of evaluation values of phase difference streaks with an evaluation value of 20 or more is 200 or less.

3. The polymeric piezoelectric film according to claim 1, wherein, when evaluated by the evaluation method A, per a length of 1,000 mm in the direction Y, a number of phase difference streaks with an evaluation value of 20 or more is 0, and a sum total of evaluation values of phase difference streaks with an evaluation value of 20 or more is 0.

4. The polymeric piezoelectric film according to claim 1, wherein internal haze for visible light is 50% or less, and a piezoelectric constant $d_{14}$ measured by a stress-charge method at 25° C. is 1 pC/N or more.

5. The polymeric piezoelectric film according to claim 1, wherein internal haze for visible light is 13% or less.

6. The polymeric piezoelectric film according to claim 1, wherein the helical chiral polymer (A) is a polylactic acid-type polymer having a main chain containing a repeating unit represented by the following Formula (1):

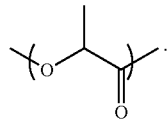 (1)

7. The polymeric piezoelectric film according to claim 1, wherein a content of the helical chiral polymer (A) is 80% by mass or more.

8. The polymeric piezoelectric film according to claim 1, wherein a product of the standardized molecular orientation MORc and the crystallinity is from 75 to 700.

9. The polymeric piezoelectric film according to claim 1, wherein internal haze for visible light is 1.0% or less.

10. The polymeric piezoelectric film according to claim 1, the film containing from 0.01 parts by mass to 10 parts by mass of a stabilizer having one or more functional groups selected from the group consisting of a carbodiimide group, an epoxy group, and an isocyanate group, the stabilizer having a weight average molecular weight of 200 to 60,000 (B) based on 100 parts by mass of the helical chiral polymer (A).

11. A method of manufacturing the polymeric piezoelectric film according to claim 1, the method comprising: extruding a composition containing the helical chiral polymer (A) from a T-die having a lip tip edge radius of from 0.001 mm to 0.100 mm at an extrusion temperature of from 200° C. to 230° C. to form the composition into a film; and stretching the formed film.

* * * * *